(12) United States Patent
Rudmann et al.

(10) Patent No.: US 7,457,490 B2
(45) Date of Patent: Nov. 25, 2008

(54) MICRO-OPTICS ON OPTOELECTRONICS

(75) Inventors: Hartmut Rudmann, Unterlunkhofen (CH); Markus Rossi, Jona (CH)

(73) Assignee: Heptagon Oy, Espoo (FI)

( * ) Notice: Subject to any disclaimer, the term of this patent is extended or adjusted under 35 U.S.C. 154(b) by 160 days.

(21) Appl. No.: 11/466,640

(22) Filed: Aug. 23, 2006

(65) Prior Publication Data
US 2007/0009223 A1 Jan. 11, 2007

Related U.S. Application Data

(63) Continuation-in-part of application No. PCT/CH2005/000109, filed on Feb. 25, 2005.

(30) Foreign Application Priority Data
Feb. 27, 2004 (EP) .................... 04405110

(51) Int. Cl.
G02B 6/12 (2006.01)
G02B 6/32 (2006.01)
(52) U.S. Cl. .......................... 385/14; 385/33
(58) Field of Classification Search .......... None
See application file for complete search history.

(56) References Cited
U.S. PATENT DOCUMENTS
2001/0032702 A1 10/2001 Feldman et al.
2002/0053742 A1 5/2002 Hata et al.
2004/0055151 A1* 3/2004 Obi et al. ............. 29/825

FOREIGN PATENT DOCUMENTS
EP 1 239 519 A2 9/2002
EP 1 389 804 A 2/2004
JP 2002353763 12/2002

OTHER PUBLICATIONS
Michael T. Gale; "Replication technology for micro-optics and optical microsystems"; Proceedings of SPIE—The International Society for Optical Engineering SPIE-Int.; vol. 5177, pp. 113-120; Bellingham, WA, 2003; XP002299415.
Peter Dannberg, et al.; "Wafer scale integration of micro-optic and optoelectronic elements by polymer UV reaction moulding"; Proceedings of the SPIE, SPIE, Bellingham, WA, US; vol. 3631, Jan. 28, 1999, pp. 244-251; XP001187520.

* cited by examiner

*Primary Examiner*—Michelle R. Connelly-Cushwa
*Assistant Examiner*—Chris Chu
(74) *Attorney, Agent, or Firm*—Rankin, Hill & Clark LLP

(57) ABSTRACT

The invention concerns the combination of optical elements with active optoelectronic to monolithic optoelectronic systems. An optoelectronic wafer (1) comprising active optical components (2) is provided with (micro-)optical structures. The optical structures (12, 13) are allocated to the active optical components (2), i.e. they are configured to influence light impinging on the active optical components (2) and/or originating from them in a desired manner. To this end they are either aligned to the optical components or otherwise adjusted to serve this purpose. The combined active optical components/optical structures are separated for example by dicing the semiconductor wafer with the optical structures into parts containing at least one active optical component (2) and at least one optical structure (12, 13).

11 Claims, 7 Drawing Sheets

MICRO-OPTICS ON OPTOELECTRONICS

BACKGROUND OF THE INVENTION

1. Field of the Invention

The invention is in the field of optoelectronic devices. It more particularly relates to methods of fabricating integrated optoelectronic devices, to optoelectronic devices fabricated using such methods, and to semifinished products, namely opto-electronic wafers provided with optical components on a wafer level.

2. Description of Related Art

The combination of optical elements with active optoelectronic devices (light emitting and light detecting) to monolithic optoelectronic systems is getting increasingly important. Since optoelectronic devices are increasingly miniaturized, in order to miniaturize such optoelectronic systems, the optical components and Microsystems need to undergo the same miniaturization. However, according to the state of the art, the (passive) optical components and systems are completely separate parts, which can not be incorporated in the fabrication chain of the optoelectronic devices.

When the (passive) optical components are included in the optoelectronic fabrication chain, an important requirement usually is that the optics is compatible with fabrication processes of the optically active component. This includes stability in high temperatures, humid environments and temperature shocks; naturally, also requirements concerning the optical function have to be guaranteed by the materials and processes: high or well defined transparency in a wavelength range of interest, accurate control of dispersion and polarization, alignment, surface shape needs to be controlled down to fractions of a wavelength, optical quality of layers: low numbers of scratches, digs, inclusions, bubbles, . . . . And finally, also, mechanical requirements have to be met, for example, protection of the optical and opto-electronic components and form stability.

BRIEF SUMMARY OF THE INVENTION

It is an object of the present invention to provide novel integrated optoelectronic systems suitable for miniaturization and methods for the fabrication thereof. The fabrication methods should bring about reduced fabrication costs.

This object is achieved by a method and a device as defined in the claims. In this document, the following definitions are used:

"Active optical device": either a light sensing or light emitting device; e.g. detector, image sensor, LED, VCSEL, laser, OLED, . . . .

"Optically active" means operable to interact with electromagnetic radiation or to emit electromagnetic radiation.

"Light": Electromagnetic radiation, especially visible, IR or UV electromagnetic radiation.

"Optoelectronic wafer": Semiconductor wafer containing an array of active optical devices with active optical components/areas.

"Passive optical component": refractive or diffractive optical component; includes also optical systems (collection of optical elements and mechanical features such as aperture stops, image planes, holders). The term is not limited to micro-optical elements but can also be used for "classical" optical elements such as lenses, prisms and mirrors.

"Optoelectronic system": System containing active and passive optical devices, elements, systems components; e.g. a CMOS camera module.

"Replication": Any technique that reproduces a given structure (or the negative thereof, respectively), including techniques such as etching, embossing, molding, etc. Most examples will be discussed referring to UV-replication, i.e. replication including a curing step with UV radiation. Replication as such, also for (micro-) optical structures has been known in the art. Replication techniques as well as methods of fabricating replication tools are not described in detail here. While replication techniques are important for the production of the optical parts in many embodiments of the invention described below, additional technologies such as wafer bonding etc. may be used in order to build the complete system.

"Micro-optics": Micro-optics, as compared to conventional optics, is based on fine structures causing refraction and/or diffraction, the structures having characteristic depths/heights and often also widths of typically a few micrometers (μm), for example of 0.1 μm-200 μm, of 0.2 μm-200 μm or of 0.5 μm-200 μm, preferably of between 0.2 μm or 0.5 μm and about 50 μm, often between 0.5 μm and about 30 μm. In other words, the characteristic profile depths and the profile widths are of the order of a few wavelengths up to a few tens of wavelengths for refractive micro-optics and of about one wavelength up to a few wavelengths for diffractive optics. As a rule of thumb, micro-optical elements have structures such that the phase relation of radiation present at different neighboring places on the structure is well-defined. This is opposed to classical, purely refractive optical elements, where the behavior of the radiation at different elements of the structure can be described in a geometrical optics picture. Micro-optical elements, thus, as opposed to classical optical elements (such as classical lenses, mirror elements etc.) can be regarded as having structures which are such that the wave nature of the light has to be taken into account and participates in the effect the micro-optical element has upon radiation. Micro-optics, in general, is an extension to classical optics. Diffractive optical elements (DOEs) are an example of micro-optical elements; often micro-optical elements with primarily diffractive effect are called DOEs even if they also have some refractive effect.

"(Micro-)optical wafer": a transparent substrate containing an array of (micro-) optical components.

The term "wafer", in the context of this document, thus is used in the classical, textbook sense for optoelectronic components, i.e. it is a disk of semiconductor material with well-defined crystalline structure and with integrated circuit structures. The term 'optical wafer' in contrast is used to describe a transparent disk-like or plate-like substrate of the size approximately corresponding to the size of a semiconductor wafer, the substrate being provided with the micro-optical structures. The optical wafer often comprises a thin film of polymer material, containing the optical (micro-)structures, on the substrate.

"Wafer-scale" as a consequence is used for processes/products having the scale of a classical semiconductor wafer or of an optical wafer. It may also be used for the describing the scale of an other product having approximately a wafer size and having a plurality of individual, often identical components for being separated thereon, for example a "wafer-scale" interposer or interconnect having a plurality of dies thereon.

It is a first principle of the invention to combine optics and optoelectronics on a wafer-scale. In other words, an optoelectronic wafer is provided with optical (micro-) structures (or micro-optical structures). The optical structures are allocated to the active optical components, i.e. they are configured to influence light impinging on the active optical components and/or originating from them in a desired manner. To this end, they are either aligned to the optical components or otherwise adjusted to serve this purpose. The combined active optical components/optical structures are separated for example by dicing the semiconductor wafer with the optical structures into parts containing at least one active optical component and at least one optical structure.

It is a second principle of the invention to provide wafer-scale replication processes that involve (micro-)optics aligned with active optical components and that also provide a well-defined 3D-structure that allows for defined 3D-positions of the optical structures with respect to the active optical components.

Preferably, for both principles, the optical (classical and/or micro-optical) structures are produced by replication. Replication techniques include embossing, molding, etc. Replication may be a component-by-component replication, where each individual structure allocated to the micro-optical elements is fabricated individually. As an alternative, replication of a plurality of structures may be achieved simultaneously by a replication tool. Ultimately, even wafer-scale replication by a wafer-size replication tool is possible.

According to a first approach, optoelectronic components and micro-optical structures are fabricated on separate wafers. The optoelectronic wafer and the optical wafer are attached and aligned on the wafer level. According to preferred embodiments, means are present for assuring precise distance and accurate alignment, such as replicated 3D-structures on the optical wafer for precise distance control.

According to a second approach, a layer of replication material (i.e. material into which one can replicate structures) with replicated (micro-)optical structures is provided directly on the optoelectronic wafer or on a transparent intermediate layer on the optoelectronic wafer. The optics may be applied/replicated directly on the optoelectronic wafer, i.e. the optoelectronic wafer serves as substrate for the replication. This method yields very compact optoelectronic systems. The alignment is already performed during the optics fabrication (for example a replication process), and there is no need to align individual wafers later on.

According to preferred embodiments, this second approach is combined with new techniques and processes for keeping some areas of the optoelectronic wafer free for a later electrical contacting, i.e. the replicated optical elements are confined to well defined areas on the optoelectronic wafer. Replication is, thus, performed on top of optically active areas/components of the wafer, but absolutely no additional material can get over areas which need to be accessible for electrical contacting.

In these embodiments, the layer of replication material, i.e. the material into which it is replicated, is structured in a manner that electrical contacting areas are completely free of electrically insulating material. This may for example be achieved by one of the following ways or a combination thereof:

photostructured replication: The (micro-)optical structures are replicated into curable material which then is selectively cured, for example by UV illumination through a mask or by sequential illumination of the desired areas by a focused or collimated radiation source. The uncured material is then removed, laying open the electrical contact areas.

Placing curable material on selected spots, and preventing it from flowing to contacting areas by means of flow-stop structures on a replication tool.

First replicating (micro-)optical structures and then gluing replicated parts on the optoelectronic wafer.

Providing a protection layer (sacrificial layer) on the optoelectronic wafer, the protection layer comprising troughs at the places where (micro-)optical structures are to be placed.

As an alternative, the replication material is placed on the optoelectronic wafer only after the contacting. In this way, the encapsulation of the electrical contacts in the transparent replication material, in addition to or as an alternative to, having an optical function also serves as protection against mechanical wear.

According to further preferred embodiments, both the first and the second approach can be combined with techniques for a reliable thickness control. According to the first approach, the distance of the optical surfaces from the optoelectronic component/device is defined by the substrate thickness itself and, preferably replicated, distance holders on a wafer level. According to the second approach, the distance of the optical element from the optically active component is determined by the thickness of the replication layer (plus possibly of an intermediate layer). This means that the (micro-) optical element(s) are not only adjusted very well in the horizontal direction but also to an accuracy down to, for example 1 μm, in the vertical direction. In the description of the preferred embodiments, novel techniques to achieve such a precision are described.

By combining the optical parts and optoelectronic devices on a wafer level, a major reduction in the fabrication cost can be achieved. However, the methods presented in the following, for achieving such a combination on the wafer level, are also applicable for individual components.

It is a third principle of the invention to provide a first layer of transparent material directly on an active optical device on an interposer (i.e. the device being between the die and the interconnect substrate/PCB) or possibly on an interconnect substrate, being contacted by the interposer by means of die bonds, the first layer preferably having a high optical transparency and a low elastic module (of for example below 10 Mpa or below a value between 1 Mpa and 10 MPa), and then to provide a second transparent layer on top of the first layer, the second transparent layer, for example, being harder than the first layer.

Such a package of a contacted active optical component has many advantages over prior art packages of active optical devices. For example, the two-layer structure allows selection from materials having beneficial properties, also in view of further process steps. Often, it is necessary to provide sufficient heat resistance for production steps which come late in an apparatus manufacturing process, such as IR reflow soldering/finishing. In addition, the surface of the package has to be hard enough not to be easily scratched. Materials combining these properties often tend to strongly contract during curing, in this way ripping off contact bonds. The two layer-structure makes it possible to select a first, relatively soft material with low shrinkage effects for the first layer. An example of a material for the first layer is cast PDMS (Polydimethylsiloxane). The second layer may be of hard material, with almost arbitrary shrinkage properties, such as curable epoxy.

Mechanical or optical structures may be, according to preferred embodiments, replicated into the second layer before curing. Mechanical structures may be indentations at the places of the active optical devices, so that the surface of the second layer is further protected from being scratched.

The first layer may be thicker than the second layer. A requirement of the first layer thickness is that it covers all structures protruding from the interposer surface, such as the component itself and bonds. An additional purpose of the first (intermediate) layer can also be to compensate for different thermal expansion coefficients of the substrate and the second (hard) layer. Effects like substrate bending after a thermal curing step can be eliminated by a proper material choice.

Packages produced according to this second principle of the invention are preferably made on a multi-component level, i.e. a large area interposer substrate comprising a plurality of bonded active optical devices may be provided. The interconnect substrate comprising all these devices may as a whole be provided with the two transparent layers. Then the interconnect substrate may be divided to yield the separated individual packages.

The third principle of the invention may be combined with the second principle of the invention, and where applicable, also with the first principle of the invention.

According to a first aspect of the invention, a method of manufacturing an integrated optical system is provided, the method including the steps of providing a wafer with active optical components, each active optical component having an optically active surface;

of providing optical structures allocated to the active optical components operable to influence electromagnetic radiation emitted by the optically active surface and/or electromagnetic radiation impinging on the optically active surface, wherein the optical structures are provided by adding a protection layer to the wafer, the protection layer partially covering the wafer's surface, by disposing transparent material in a liquid or plastically deformable state, to at least some of the active optical components, by replicating the optical structures by a replication tool, in an aligned manner, in a surface of the transparent material, wherein in the replication process the replication tool abuts the protection layer, or a protrusion thereof, and by removing the protection layer;

the method further comprising the step of separating the semiconductor wafer with the optical structures into parts containing at least one active optical component and at least one optical structure.

According to an other aspect of the invention, a method of manufacturing a plurality of optical devices is provided, the method including the steps of providing a first wafer-scale component and a second wafer-scale component;

adding spacer elements to a first side of the first wafer, the spacer elements being of curable deformable material;

adding, in an aligned manner, the second wafer-scale component, so that a first side of the second wafer-scale component is in contact with the spacer elements;

curing the spacer elements, wherein during curing of the spacer elements a spacing between the first wafer and the second wafer-scale component is controlled; and dividing a resulting assembly comprising the first wafer-scale component, the second wafer-scale component, and the spacer elements into a plurality of devices.

According to yet another aspect, the invention concerns a method of manufacturing an integrated optical package comprising at least one optoelectronic device including the steps of providing a substrate with a plurality of optically active components;

applying transparent material to the substrate, the transparent material at least partially covering the optically active components, wherein the transparent material comprises at least two layers of transparent material, wherein a first one of the at least two layers covering the active optical components is thicker than an outermost one of the at least two layers, and wherein the material of the outermost one of the at least two layers is different from the material of the first one of the at least two layers;

adding, by replication, optical structures to the outermost one of the at least two layers; and separating the substrate wafer with the transparent material into parts containing an optically active component encapsulated by the transparent material.

The invention also concerns an integrated optical package, comprising an active optical component on a substrate, the active optical component being encapsulated by a first layer of transparent material, and at least one further layer of transparent material different from the material of the first layer, on top of the first layer, wherein the at least one further layer comprises structures added by replication.

BRIEF DESCRIPTION OF THE DRAWINGS

In the following, embodiments of the invention are discussed with reference to schematic not-to-scale drawings. The figures show the following.

In the figures, corresponding elements are provided with same reference numerals.

DETAILED DESCRIPTION OF THE PREFERRED EMBODIMENTS OF THE INVENTION

Figure 1:
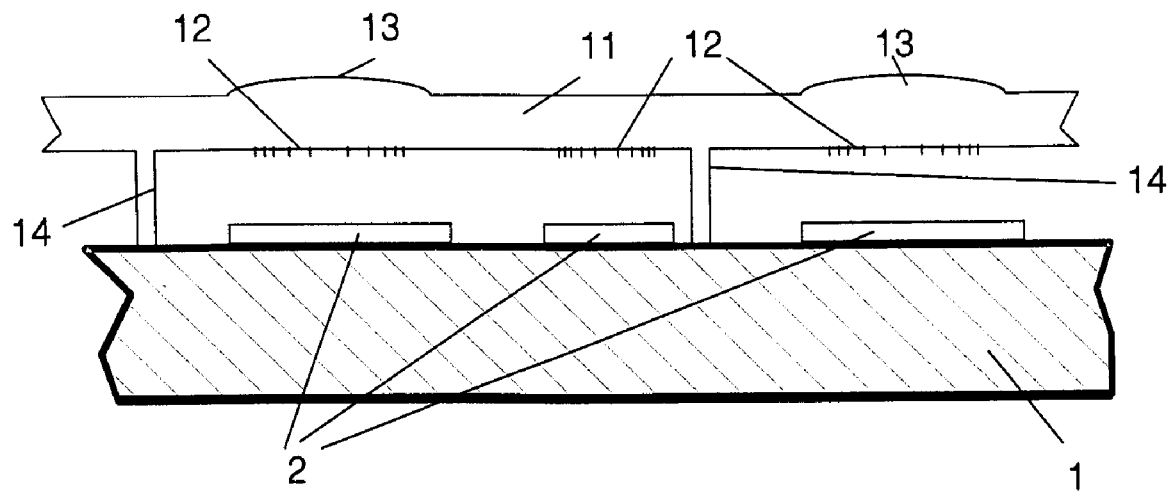
FIG. 1: A first embodiment of a wafer-scale combination of an optoelectronic wafer with optical structures.

The embodiment shown in FIG. 1 comprises an optoelectronic wafer 1 with a plurality of optically active components 2, for example lasers, photo-detectors, light emitting devices etc. It further comprises an optical wafer 11 with replicated structures. The replicated structures include diffractive optical structures 12 as well as refractive structures 13 and may, for example, be arranged on both surfaces, i.e. on both sides of the optical wafer. The optical wafer may be a glass disk provided on both sides with a layer of an embossable material such as UV curable epoxy, in which material the structures are replicated. The optical wafer, further to optical structures such as (micro-) lenses, diffractive optical elements or gratings, comprises distance holders 14, such as posts, pillars, walls. The distance holders are replicated structures and have been replicated into the embossable material by means of the replication tool with which the optical structures 12 were also replicated. As an alternative, the distance holders are replicated by a separate replication or printing process.

A process for manufacturing a device as described is then as follows:

a) A replication tool is provided that contains micro-optical and micro-mechanical features (there are various ways to produce such a replication tool; among them is a process described in the European patent application 03 405 888.3, the process of combining lattice-like structures and micro-optical structures described therein and shown in FIGS. 2-6 is hereby incorporated by reference). The micro-mechanical features are designed in a way that they fit either in a mechanical counter-structure on the optoelectronic wafer or on some free area on the wafer.

b) The structures are replicated by a suitable process, typically an embossing or molding process on the optical wafer. Afterwards, if the substrate of the optical wafer does not have the same size as the optoelectronic wafer (often the substrate will be chosen in the same size), a cutting step may be carried out yielding a wafer of the size of the optoelectronic wafer.

c) the optical wafer is positioned and aligned on the optoelectronic wafer (for example on a mask aligner)

d) The wafers are bonded to each other. A preferred method is gluing: the optical (transparent) adhesive is dispensed on the optoelectronic wafer and the optical wafer is brought in contact on the pillars/distance holders and cured via UV-light or elevated temperature.

Figure 20:
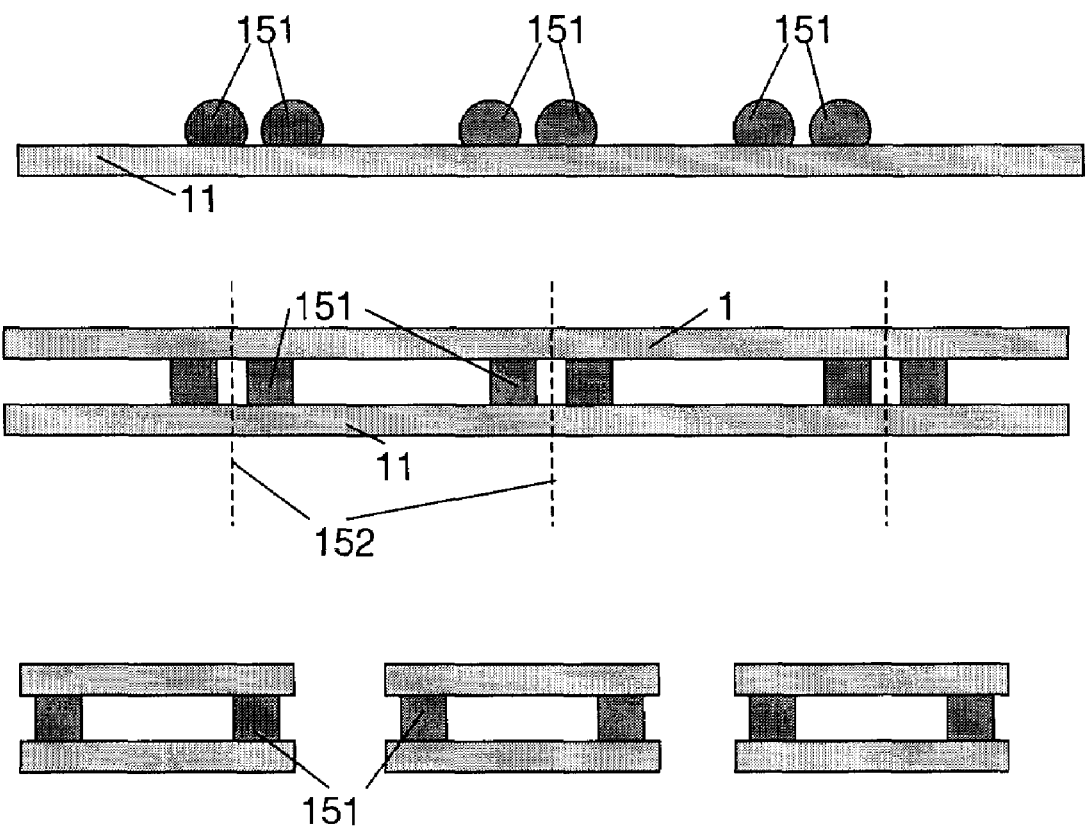
FIG. 20 a further embodiment of wafer-scale combination of an optoelectronic wafer with optical structures.

FIG. 20 shows a somewhat different approach for bonding an optoelectronic wafer and an optical wafer to each other. First, the optical structures (not shown in FIG. 20) are replicated on the optical wafer 11. Then, spacer elements 151 are added on either the optical wafer or the optoelectronic wafer, as shown in the upper panel of the figure. In the figure, the spacer elements 151 are added on the optical wafer. This can be done in a printing process (in an aligned way) or in a process using a spacer replication tool. The spacers are, for example, arranged in a manner that they are near the edges of the devices to be fabricated; they may even surround said devices. After the printing or a like process, the spacer elements are still soft, as hinted by the cross-section shape in FIG. 20. As a next step, the other wafer (in the shown embodiment the opto-electronic wafer 1) is added in an aligned manner. This is represented in the middle panel of the figure. During the curing process, the distance between the wafers is controlled by appropriate spacing control means, for example, arranged at the wafer edges. Then, the spacer elements are cured. Finally, the devices to be fabricated are separated, for example by dicing along dicing lines 152. The resulting devices are shown in the lowest panel of FIG. 20.

A dicing process, in this and other embodiments described herein may be a conventional one-cut dicing process. As an alternative, it may be a two-step procedure including a first step (a 'pre-dicing' step), in which the wafer assembly is pre-cut using a broad saw blade. In this first step, merely the replication material is removed, whereas the substrate is merely sawed into. In a second step, the substrate is sawed through. This two-step procedure leaves additional stepping at the borders of the resulting product.

The spacer elements may be made of any curable or otherwise hardening material, for example UV curable epoxy. They need not be transparent, therefore, the spacer material may be chosen from a large variety of materials.

Figure 21:
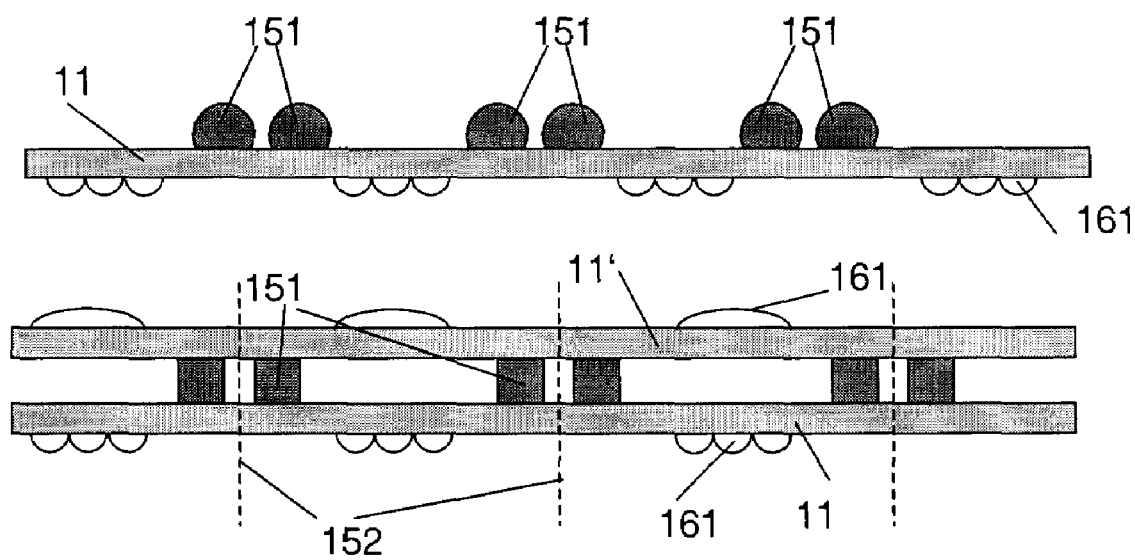
FIG. 21 a variant of the embodiment of FIG. 20 where two optical wafers are combined.
Figure 4:
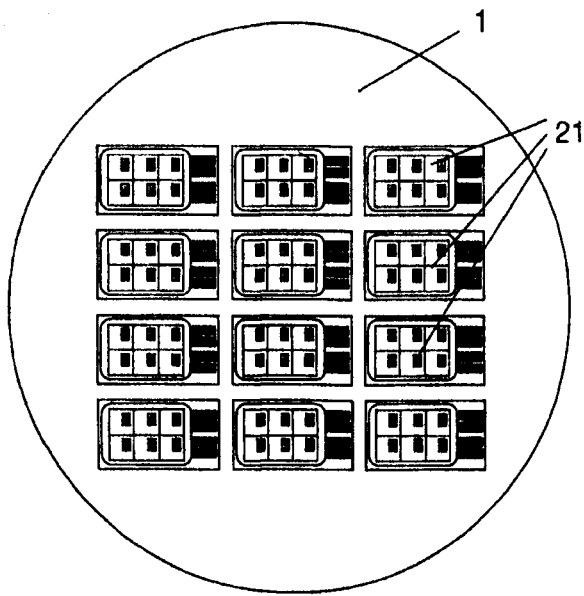
Figure 5:
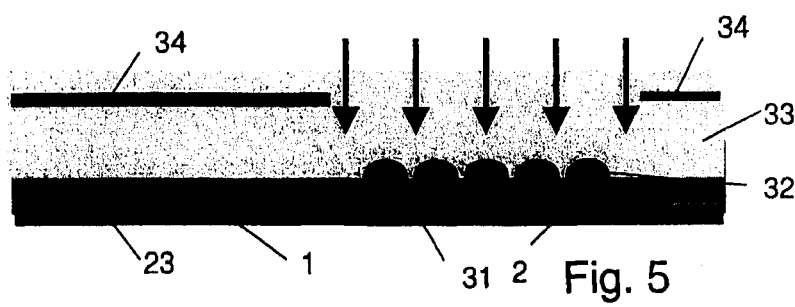
Figure 6:
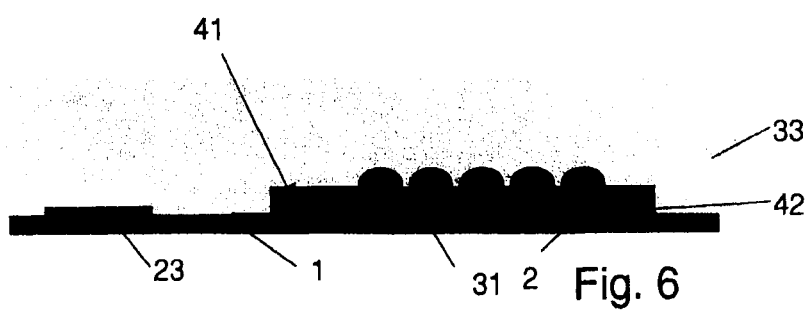
Figure 7:
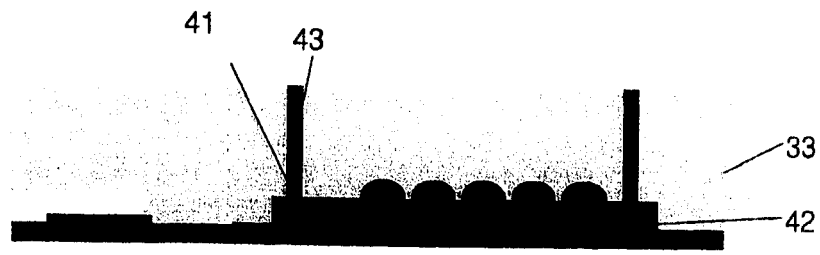
Figure 8:
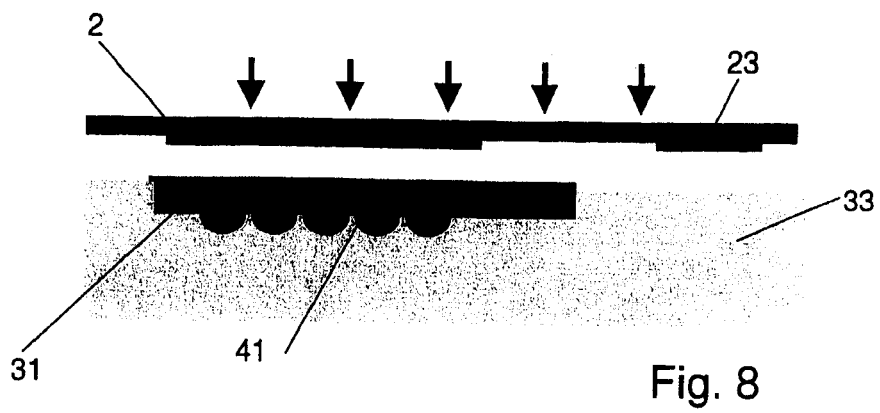
Figure 9:
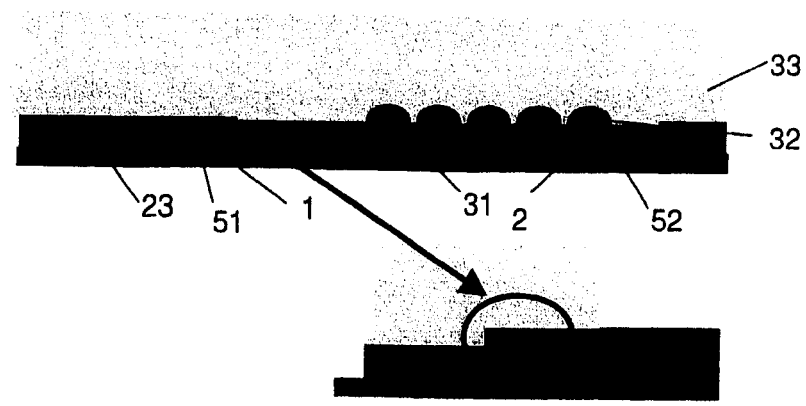
Figure 10:
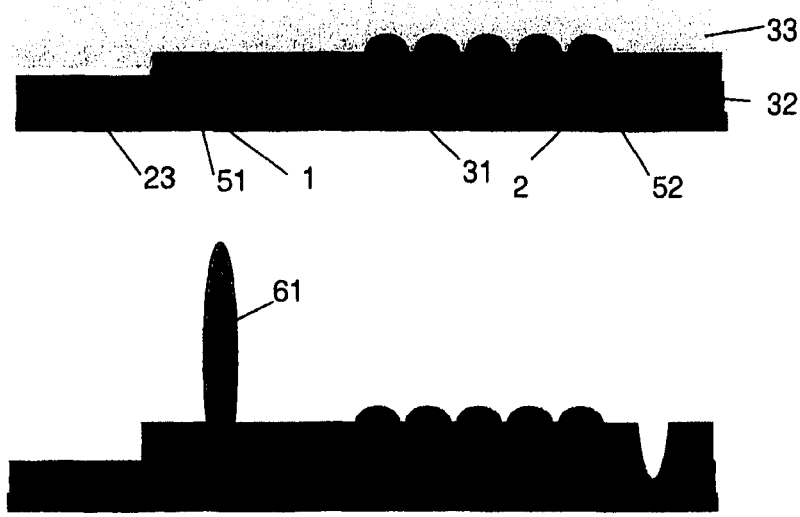
Figure 11:
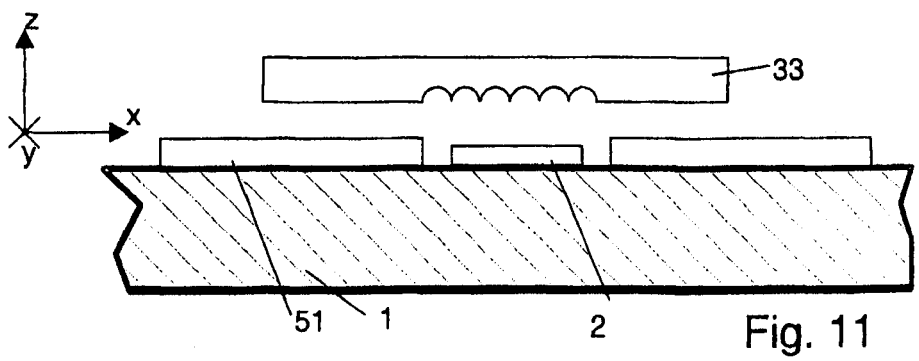
Figure 12:
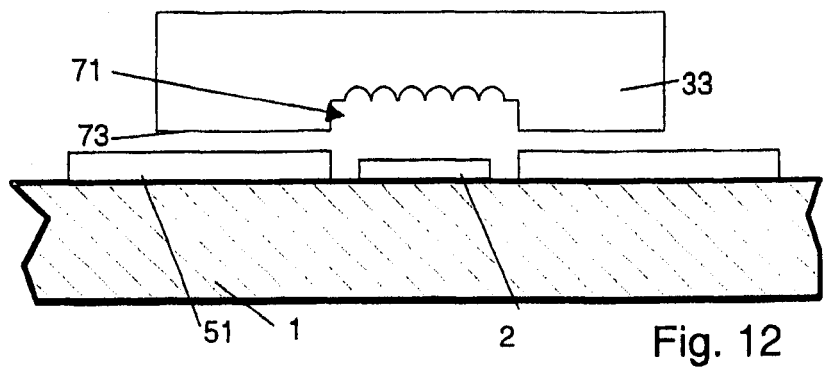
Figure 17:
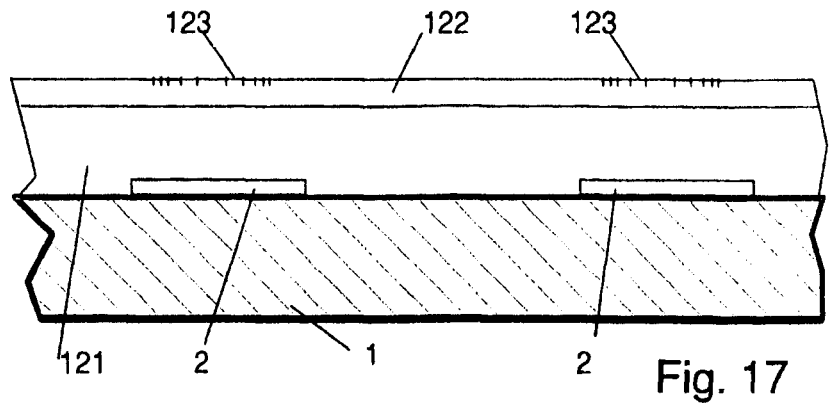
Figure 18:
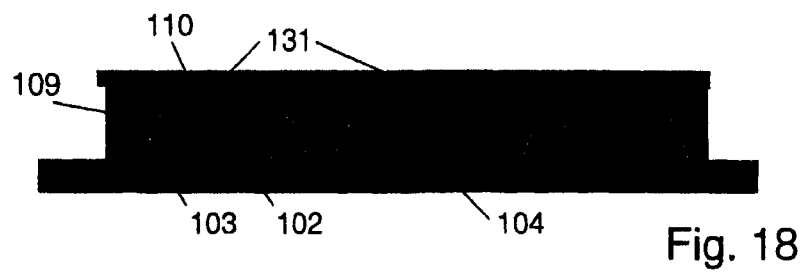
Figure 19:
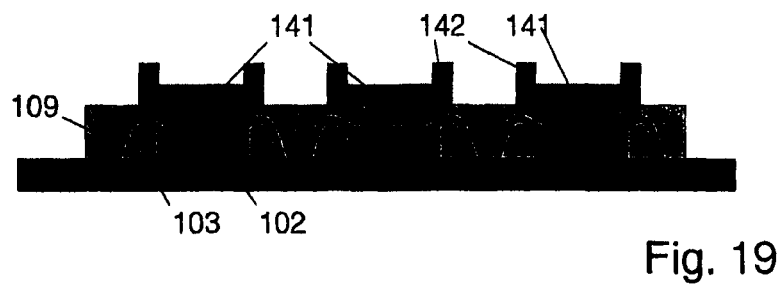

The above-described technique of combining two wafer elements by means of spacer elements which are cured may also be applied to other optically functional wafers than an optoelectronic wafer and an optical wafer. Especially, the technique may also be applied to the combination of two optical, for example transparent wafers. This is illustrated in FIG. 21, where both, the first wafer 11 and the second wafer 11' are optical wafers. In the shown embodiment, the first wafer and the second wafer are both transparent and both comprise, on a second, 'outer' side, refractive and/or diffractive optical structures 161. Such structures have been added, prior to assembling the wafers with each other by the method described herein, by replication into transparent material. Optionally, the first or the second or both, the first and the second wafer may in addition, or as an alternative, comprise refractive and/or diffractive optical structures on the first 'inner' side, which is the side that is in contact with the spacer elements 151.

As an alternative, optical structures on the outer side may also be added after assembling the first and second wafers, i.e. after the spacer elements have been cured. To this end, liquid or viscous or plastically deformable replication material is disposed uniformly or at discrete spots on the second side of the first and/or the second wafer and/or on a replication tool. Thereafter, the replication tool is positioned so as to deform the replication material in the desired manner, and the replication material is hardened, for example, by having appropriate radiation impinge on it. Then, the replication tool is removed. Of course, there may also be a two-sided replication where a replication tool engages both sides.

In FIG. 21, the dicing lines 152, along which the assembly is to be divided into individual devices, are also shown. Prior to dicing, further parts may optionally be added, such as an optoelectronic wafer, a pre-packaged assembly of an array of electrically contacted optoelectronic devices (such as CCD or CMOS sensor arrangements etc.), protection layers, filters etc.

The method is also applicable to the combination of other kinds of wafer-scale components, for example the combination of a pre-manufactured printed wiring board (including high density interconnect) with an array of optoelectronic devices thereon with a transparent disk (optical wafer) with a corresponding array of optical components, such as refractive or diffractive lenses.

An alternative approach is to provide a layer of embossable material with embossed (micro-)optical structures directly on the optoelectronic wafer or on a transparent intermediate layer on the optoelectronic wafer. Also, combinations of the two approaches are possible: an optoelectronic wafer with a layer of transparent material, into which optical structures are embossed, may be combined with a separate optical wafer.

Depending on the structure of the optoelectronic wafer, in such 'overmolding' embodiments, the keeping free of contacting areas of non-conductive material has to be carefully taken into account.

Figure 2:
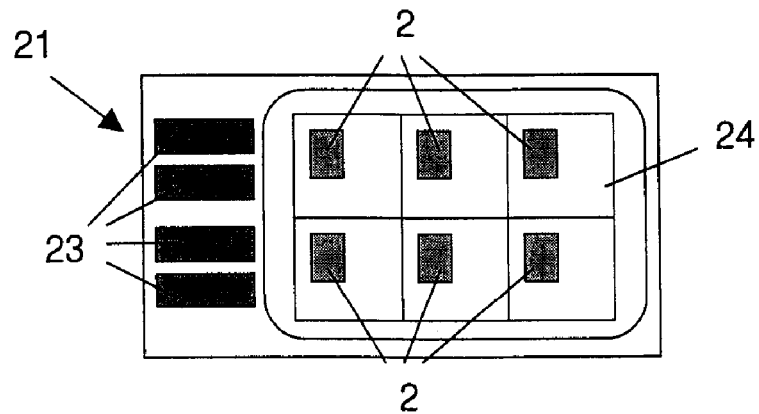
FIGS. 2 and 3: top and side views of an optoelectronic device.
Figure 3:

FIGS. 2 and 3 show an optoelectronic device 21 (here being a sensor die, i.e. a semiconductor device without a housing) comprising several optically active areas 2 as well as bonding pads 23 spaced from the optically active areas. In this example optical sensors with an array of active areas are shown, but any other kind of device with at least one optically active area (component) is also included. These areas, for electrical contacting, are in this case on the side of the array of optically active areas; depending on the layout of the device they can also be arranged in an arbitrary way, e.g. a bonding area close to each optoelectronic component. Microlenses 24, being examples of passive optical components, are allocated to the optically active areas by being placed directly on top of them. In the example shown, a micro-optical structure is provided for each optically active area separately, however, it would also be possible that one structure collects the light of several active areas. Further, in the shown example, the layer of embossable material is contiguous over the entire device. However, it could in principle also be interrupted between the micro-optical structures.

Figure 4:
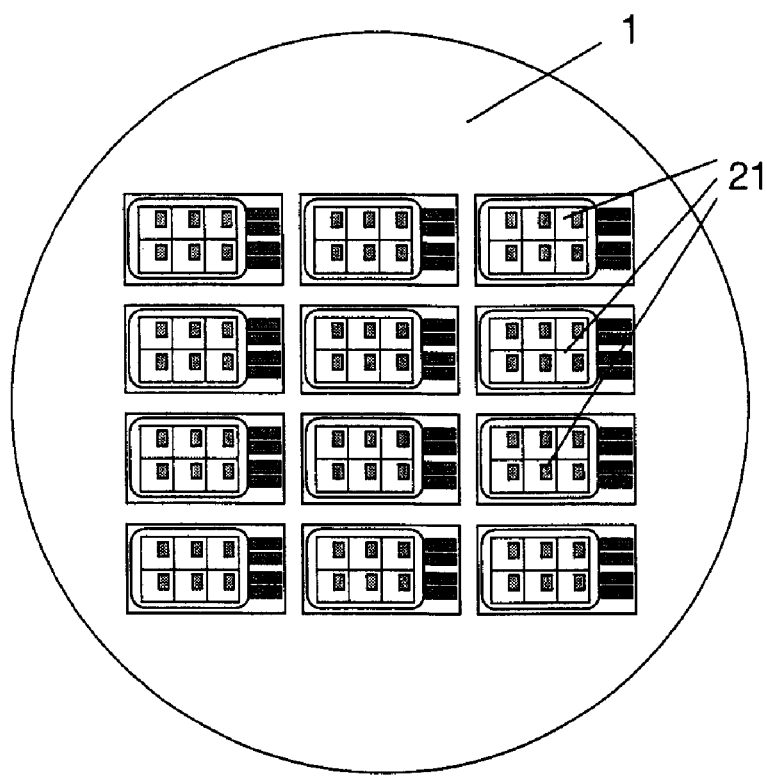
FIG. 4: a wafer comprising a plurality of optoelectronic devices.

The optoelectronic device 21 is produced from a wafer 1 containing a plurality of optoelectronic devices, as shown in FIG. 4.

From FIGS. 2-4, it becomes clear that it often is necessary to provide the (passive) optical components or systems in a manner in which they are locally very well defined and especially do not interfere with the requirement to electrically contact (for example by bonding) the device. Preferably, this local confinement can be reached on a wafer level.

Figure 5:
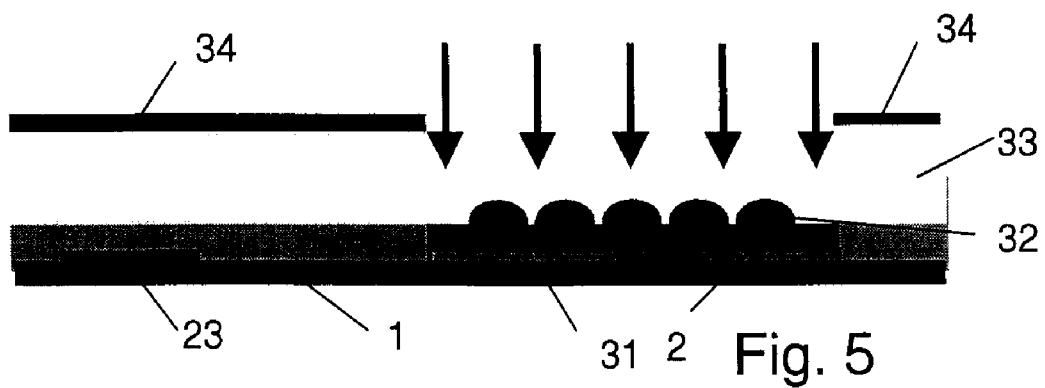
FIG. 5: A method of photostructured replication.

FIG. 5 depicts a first example of a process for assuring confinement of the passive optical components. The electrical contacting area is kept free of replication material by a "photo-structured" replication process. According to this process, deformable material 31, which is curable by radiation, for example UV radiation, is provided on the optoelectronic wafer 1. Then, the desired structure 32 is replicated into the material, for example by embossing. The replication tool used 33, therefore, may have to be aligned with the optoelectronic wafer in case the optical structures of the passive optical component are designed individually for the optically active areas. A mask 34 provided in the replication tool 33 (then being transparent for the curing radiation) or anywhere in the optical path provides for illumination of only the one area to be covered by the optical element. The uncured material is washed or developed away after the curing process.

Figure 6:
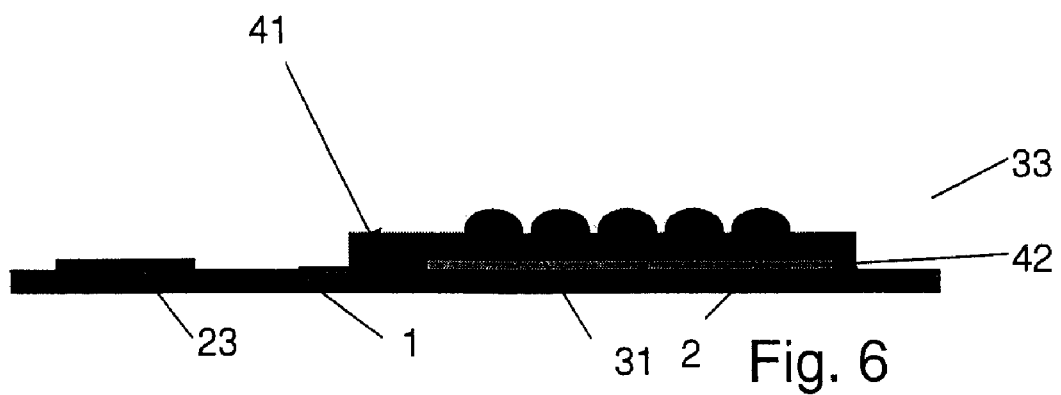
FIGS. 6 and 7 methods of locally confined (or selective) replication by means of flow stops.
Figure 7:
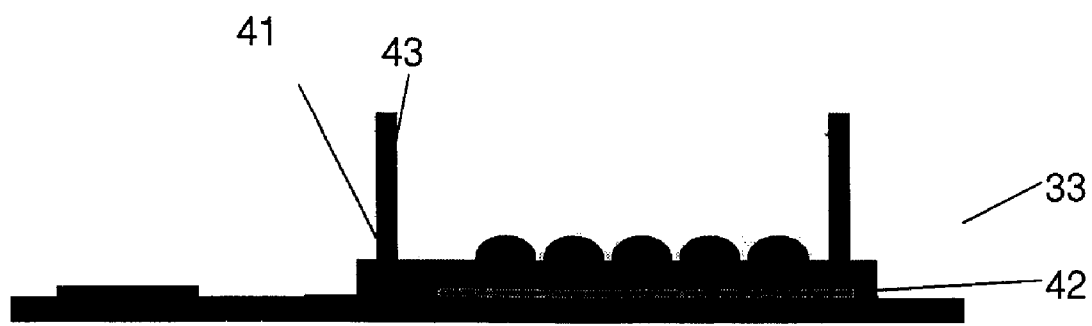

An alternative is sketched in FIGS. 6 and 7. The local confinement of the replication is achieved by replicating into a cavity-like structure. The deformable, curable replication material 31 is dispensed on the optically active area. The optical micro-structures are embossed into the liquid material. The replication tool 33 comprises a trough like feature, in which the (micro-optical) structures are arranged. It is thus formed in a way that during the replication step it forms a cavity 41 and seals off the areas of the optoelectronic wafer which need to be kept clear by cavity wall structures 42. The replication material in the cavity is cured. The form of the cavity 41 can include special volumes to prevent the formation of air bubbles or other effects that can occur when the amount of the dispensed liquid does not perfectly match the volume needed for the optical elements. These additional volumes (reservoir) can either be on the wafer plane or can be spaced from the wafer plane in the perpendicular direction. The volumes can be located in or connected to channels 43 that can also be used to pump the uncured material into the cavity, as shown in FIG. 7, in an injection molding like process step.

Figure 8:
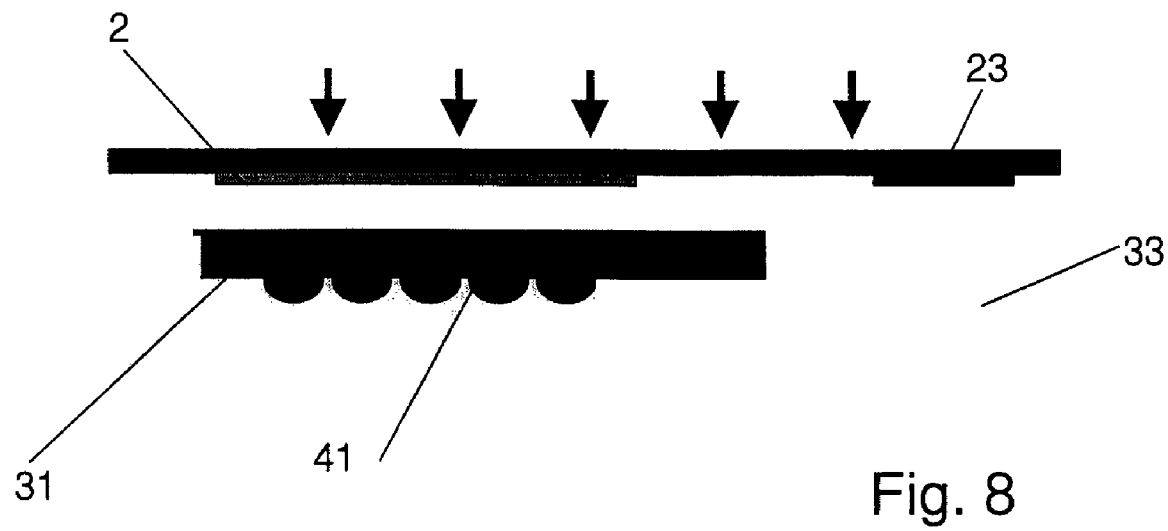
FIG. 8 a variant of the method of locally confined replication.

FIG. 8 shows yet another possibility: the (micro-) optical element is fabricated by dispensing replication material in a cavity 43 of the replication tool 42 and is then cured. The cured elements are attached to the optoelectronic wafer by an aligned bonding process such as an aligned gluing process. This possibility may be combined with the embodiment shown in FIG. 8. According to an alternative process, the optoelectronic wafer and the replication tool may first be aligned. Then, the replication material is dispensed into the trough like feature of the replication tool. Next, the replication tool is, still being aligned, brought into contact with the optoelectronic wafer. Finally, the replication material is cured.

Figure 9:
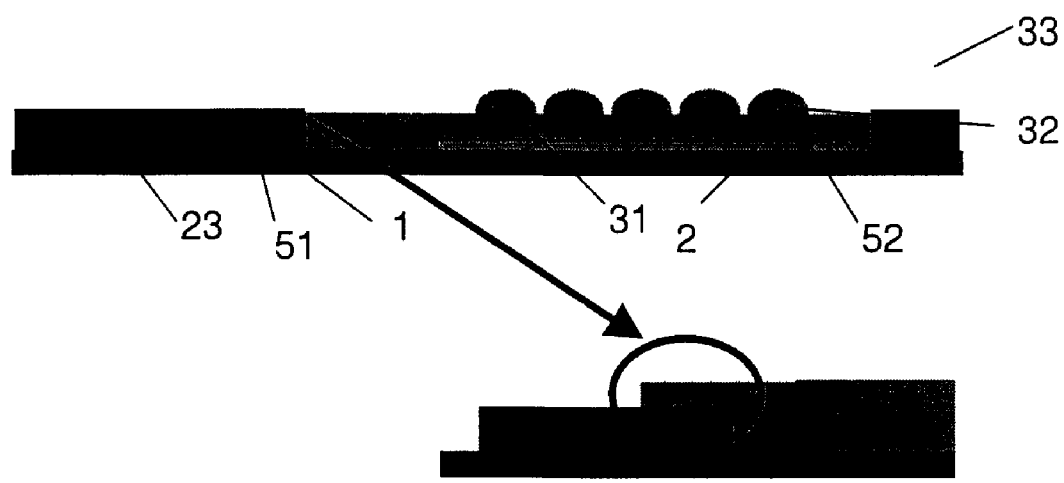
FIGS. 9 and 10 methods including the use of a protection layer.
Figure 10:
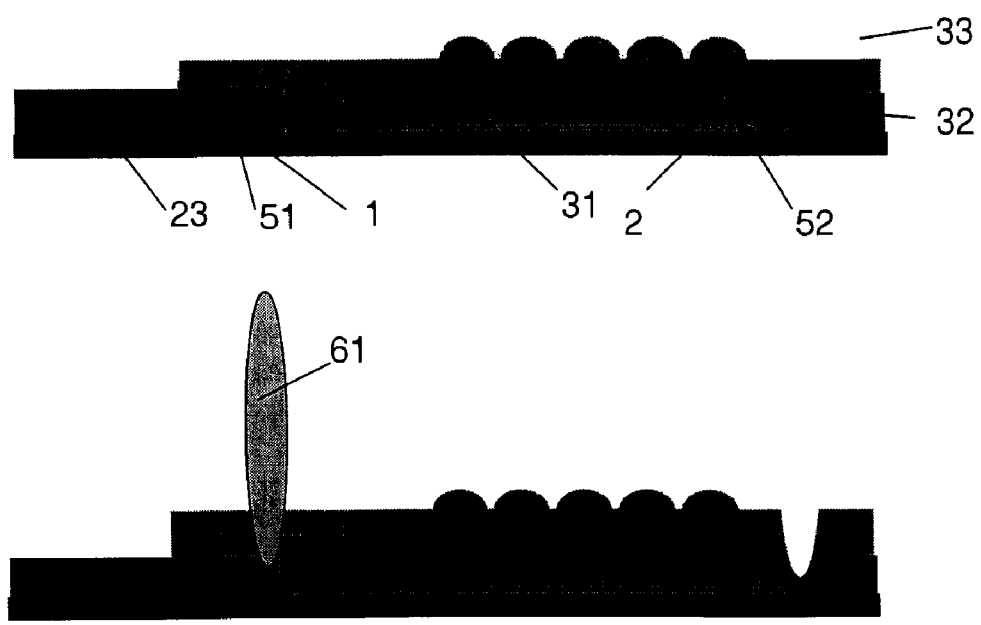

FIGS. 9 and 10 show yet another different principle of locally confined replication. In a first step, the areas which need to be clear of any non-conductive material, are covered by a protection layer 51. The protection layer protects all areas which have to be free of non-conducting material, for example because they have to be contacted electrically. The protection layer may have a lattice like structure forming an array of troughs 52 comprising the active optical components. As an alternative, the protection layer may comprise a plurality of disjointed proportions covering areas to be protected or any other shape assuring protection of the contacting areas. This may but does not necessarily implicate that the protection layer covers all areas which have to be free of non-conducting material. For example, if the protection layer has the shape of a lattice, forming troughs which comprise the active optical components, it does not necessarily have to cover the contacting areas. This is in case the replication material is dispensed in the individual troughs (see below).

In the subsequent replication step, the protection layer serves as a kind of mask. The protection layer may for example be some kind of resist structured in a manner known in the art.

If the protection layer forms an array of troughs 52, for example as shown in the mentioned European patent application 03 405 888, the micro-optical elements are replicated into the troughs. The replication material then is preferably, but not necessarily dispensed locally into the troughs. The desired structure is embossed into the liquid or plastically deformable replication material by means of the replication tool 33, for example, for many array elements simultaneously. For this, the replication tool and the underlying opto-electronic component usually need to be aligned. Then, a curing step follows. This can be for one cavity/trough or a small number of cavities/troughs at a time. Then, for example, replication is achieved for each trough or a small number of troughs individually, and the replication step is directly followed by a curing step. This is repeated, for example using the same replication tool, for further cavities/troughs. As an, often preferred alternative, replication and curing is done for the whole wafer or a large fraction of cavities/troughs at once.

After the curing, the protection layer 51 on the electrical contacting areas is washed away, typically if it is made of resist material, by being dissolved. The lower panel of FIG. 9 shows how, even if dispensed into the cavities/troughs individually, replication material might spill over the edge of the sacrificial layer. This can affect the accuracy of the height h of the micro-optics above the optically active area/component (cf. FIG. 3). Under certain circumstances it can also lead to problems in dissolving the sacrificial layer and to an unclear definition of the shape of the micro-optical element. This can be avoided by a dicing process after the curing and prior to the dissolving step as shown in FIG. 10. The upper panel of FIG. 10 shows the situation with replication material 56 spilled over the edge of the sacrificial layer 51 during embossing. In the lower panel, very symbolically a dicing tool 61 is shown. In practice, dicing can be either done by a mechanical tool such as a wafer saw, a punch cutter etc. or by laser cutting etc. An additional function the sacrificial layer may fulfill is the protection of the wafer underneath in the dicing/cutting process.

Figure 11:
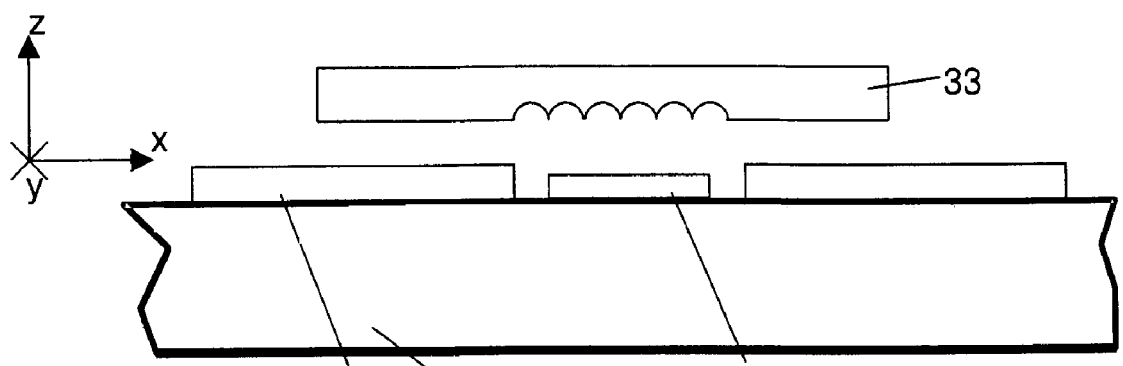
FIGS. 11-13 an illustration of the thickness control.
Figure 12:
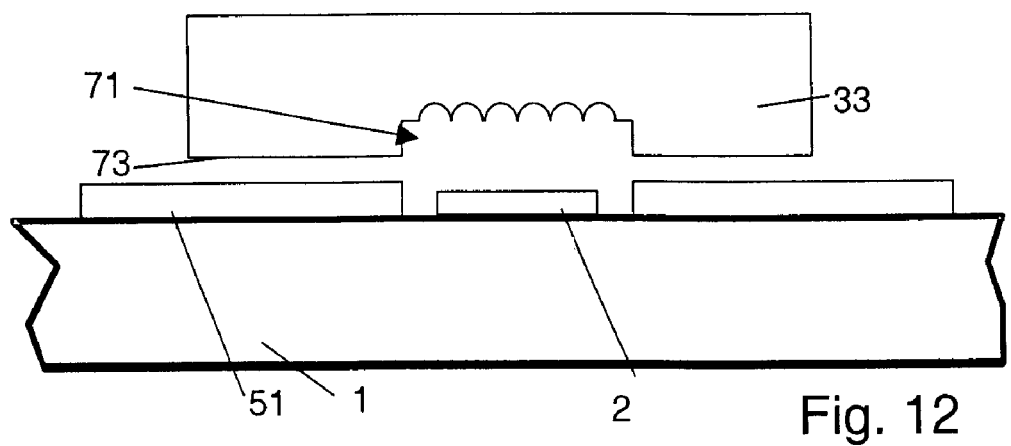
Figure 13:
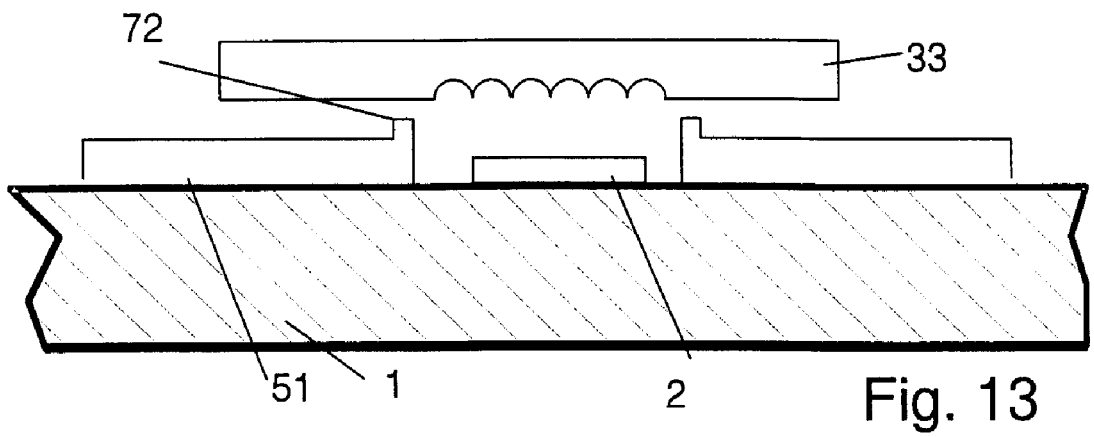

For the optical function, a correct 3D-alignment is important in many embodiments. Whereas the lateral accuracy (i.e. the accuracy in the x and y direction) is taken care of by alignment in the replication process, there are other measures for assuring a correct z position. The accurate control of the height h of the optics above the optical active area may require special precautions that are depicted in FIGS. 11, 12 and 13. FIG. 11 shows an embodiment without special precautions for thickness. If the thickness h is critical, a precise control of the thickness of the sacrificial layer is required. While a precision of 10-20 μm is sufficient for some applications, 2 μm or even 1 μm can be required for demanding applications. Typical heights h are between 5 μm and 100 μm, but even only a few mm's can be required. Depending on the actual value for h and the used materials, the required accuracy can be hard to realize with the approach of FIG. 11. It can be very difficult to find the suitable processes and parameters or alternative materials. Also, the spilling of replication material between the replication tool and the sacrificial layer can cause an additional uncertainty (as shown in the lower panel of FIG. 9).

These problems can be overcome by the approaches shown in FIGS. 12 and 13 or an arbitrary combination of the described principles. As a first step, the sacrificial layer is fabricated with a process yielding an accurate and repeatable thickness. Any deviations from the value required by the optical system design can be compensated for by forming a recess 71 or cavity in the replication tool 33. A 'recess' in this context is a region on the replication tool, in which the structures to be replicated are offset with respect to the surface 73 of the replication tool 33 by a certain, well-defined distance. In this way, a height h which is enhanced compared to the thickness of the sacrificial layer may be accomplished by a sacrificial layer 51 comprising abutment protrusions 72, as shown in FIG. 13. These abutment protrusions, if placed around the trough, also avoid the effect described as "spilling" above. The technologies in the fabrication of a tool are similar to micro-machining and high-precision mechanics, i.e. a very good control of the recess depth can be guaranteed. Since this needs only to be done in the tooling, one can use more costly techniques to reach the final accuracy. This follows a general principle according to which on the replication side a standard process that yields high accuracy is used, whereas on the tooling side a costly and very precise process to reach the required "odd" values may be used.

Figure 14:
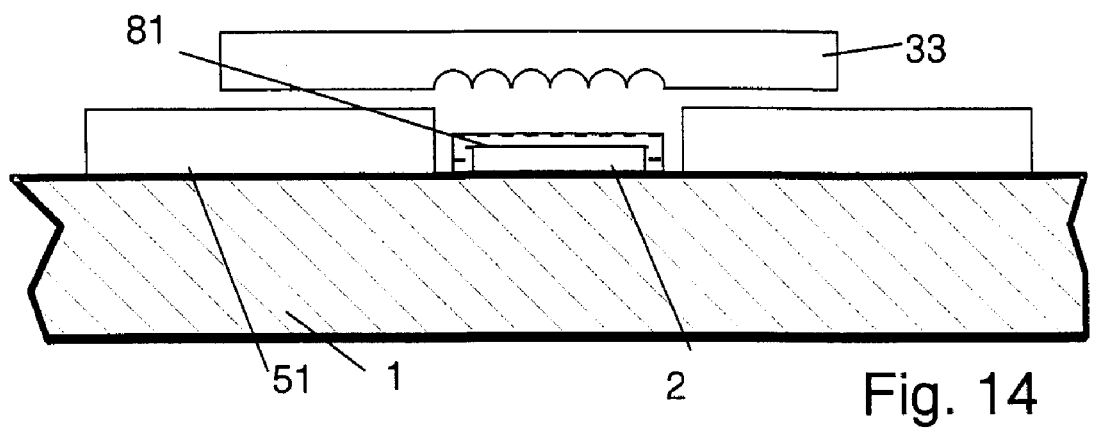
FIG. 14 an illustration of the fabrication of a bridge like structure.

A major advantage of using sacrificial layers is the fact that they can also be used to generate more complex shapes and forms of the replicated micro-optical elements. One possibility is to also apply a thin sacrificial layer portion on the active area. After curing and removing it by a development process, bridge-like structures can be formed. An example is shown in FIG. 14. A sacrificial layer portion 81 is placed on top of the active component 2, here for example, being a laser structure (namely for example a VCSEL). After removing this sacrificial layer portion, a bridge structure constituting an air gap is formed. Such air gaps may be required by certain active optical devices.

The above described examples include dispensing curable replication material on the wafer or on selected spots on the wafer. Such curable replication material is, for example, UV curable epoxy or polymer curable by heat treatment. However, there are alternatives to this approach. A first alternative is hot embossing in a thermoplastic material, i.e. a material that is plastically deformable at an elevated temperature. A second alternative is the lamination of a plastically deformable layer directly on top of the wafer. The structures may be laminated directly into the wafer. In a subsequent curing or cooling step the, layer may be hardened. Instead of lamination, the plastically deformable layer may be glued to the wafer.

Figure 15:
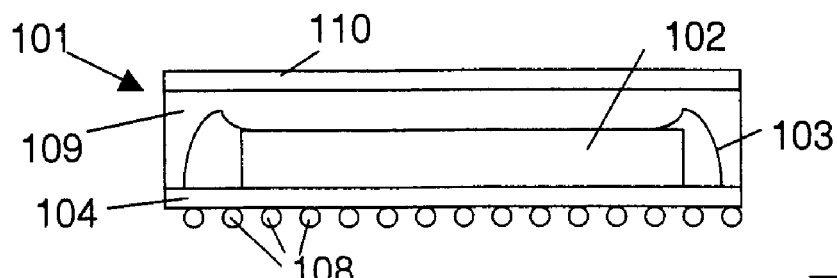
FIGS. 15 and 16 examples of packaging not including any optical structure.

A further principle of the invention is described referring to FIG. 15. According to the state of the art, the encapsulating into transparent material of an active optical die bonded to an interposer was not feasible, especially for applications including subsequent heating steps, such as IR reflow steps. A reason therefore is that there is known transparent material that could be cast onto the bonded die and then hardened without breaking the bonds.

The aspect of the invention described referring to FIG. 15 is based on the insight that the semiconductor component/device may be encapsulated by a two-layered system. The materials in the volume underneath an outermost protecting layer need to have some required properties, like compatibility with environmental testing, the optoelectronic fabrication process (e.g. IR reflow) and optical transparency and quality. A basic principle is that the first layer has the function to create a certain distance (e.g. be thick enough for covering and protecting bonding wires or place optics at correct z-position) and to ensure mechanical parameters (in this case: have a low E-module to reduce mechanical stress). A material class that has proven to be suitable for being in the 'volume' layer are materials with a low elastic module and a high optical transparency. This is since high volumes of this material are being subjected to environmental conditions that involve high and fast temperature changes. In order to avoid bending of a thick layer on top of thin or flexible substrates one has two options:

use a material with the same Coefficient of Thermal Expansion (CTE) as the substrate and the outermost protection layer. This is typically not possible with plastics (top) and semiconductors (bottom);

use a material with a very low E-module (i.e. low expansion)

PDMS is an example for such a material. PDMS also fulfills (next to the low E-Module) the further requirements such as a high optical transparency, a high resistance against environmental testing conditions.

It is, however, sufficient if only the outermost layer has further physical properties such as hardness or scratch resistance. The topmost layer, next to transparency and to the compatibility with processes such as IR reflow also needs to be compatible with microstructuring technologies like replication, and has to offer protection (hard, "shielding" in high moisture, extreme temperatures.

FIG. 15 shows the encapsulation of a die 102 contacted by bonds 103 in a chip 101. The die is placed 102 on an interposer 104 comprising, on its back side, an array of solder bumps 108 (ball grid array, BGA) for contacting an interconnect substrate or printed circuit board (not shown). The transparent material is placed directly on the active optical transparent protection material and comprises two layers, a PDMS layer 109 and a thin outermost epoxy layer 110 on top of the PDMS layer.

Figure 16:
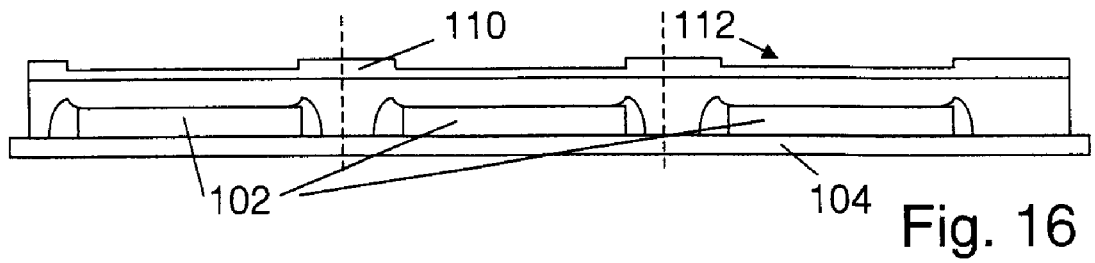

FIG. 16 shows an example of a semifinished product during the fabrication of an optoelectronic chip. The semifinished product comprises a large area ("wafer-scale") interposer 104 with a plurality of optoelectronic dies 102, contacted by bonding and encapsulated as a whole by a first layer of transparent material, such as PDMS. The first layer of transparent material is covered by a second layer of transparent material 110, such as a curable epoxy. The second layer of transparent material comprises replicated mechanical structures, namely indentations 112 at the places of the optoelectronic dies. The indentations protect the chip surface at the places provided for incoming or outgoing light from being scratched.

For manufacturing the final chip, the semifinished product is disjointed between die individual dies, as indicated by the dashed lines in the figure, leaving separated packaged chips.

This principle of the invention may also be used for further configurations known in the art that include optoelectronic dies to be packaged, and even for dies without any optoelectronic functionality, including flip-chip contacted dies.

This principle of encapsulating the active device into a transparent two-layer system can be combined, preferably on a wafer level, or on a large area interposer comprising a plurality of dies, with the principle of direct combination of active optical components with passive optical components.

Especially, the approaches described referring to FIGS. 2-14 can reach their limits when the distance between the optoelectronic wafer or components and the lens function gets into the range of more then 50-100 µm. The above described processes are in principle still feasible, but very thick layers of a replication material can be very time consuming to harden (e.g. by UV-curing). Shrinkage effects during the hardening can lead to an inaccurate positioning of the lens in the vertical direction. On a wafer scale, these effects can even lead to bending or breaking of the optoelectronic wafer. This potential problem can be overcome by the fact that not all the material between the optoelectronic wafer and the optical surface needs to be the replication material. Instead, only the uppermost layer of a two-layer system has to have the properties to be compatible with the replication process.

Figure 17:
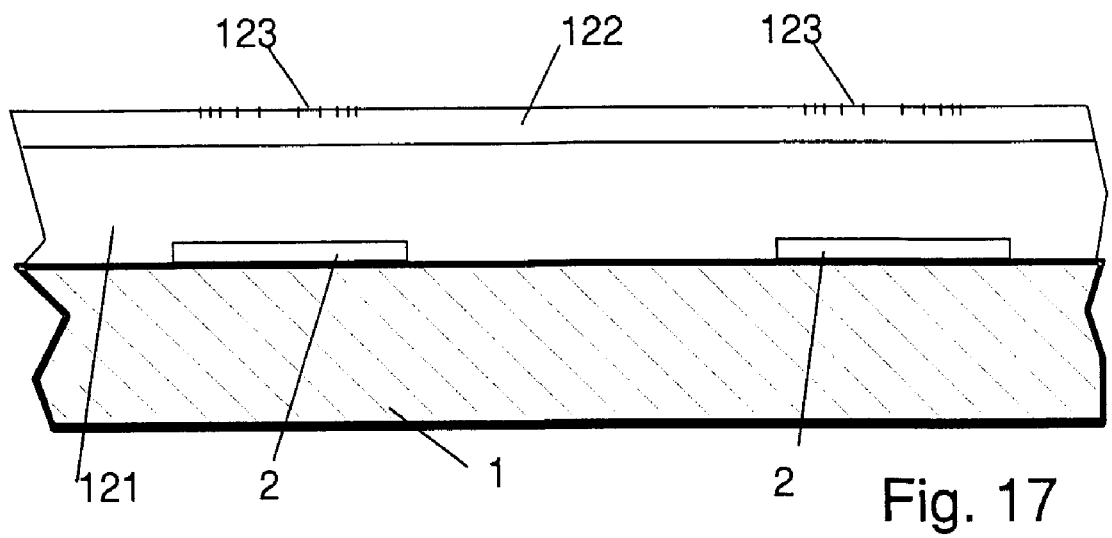
FIG. 17 a further embodiment of a wafer-scale combination of an optoelectronic wafer with optical structures.

An according embodiment of the invention is shown in FIG. 17. An optoelectronic wafer 1 comprising a plurality of active optical components 2 is provided with a PDMS layer 121 encapsulating the active optical components. On top of the PDMS layer 121, a layer 122 of replication material, for example UV curable epoxy, is placed. The replication layer comprises replicated structures 123 implementing (passive) optical functionality. The structures are allocated to the optically active components and are, for example, aligned to them.

On top of the "low E-module material" there can also be another optical wafer with a replicated layer on top of it. Glass, as an example, has an excellent adhesion to PDMS. More in general, replication is not restricted to be directly in the layer applied to the PDMS layer, but may also be done before the second layer, comprising the replicated structures, is added.

Figure 18:
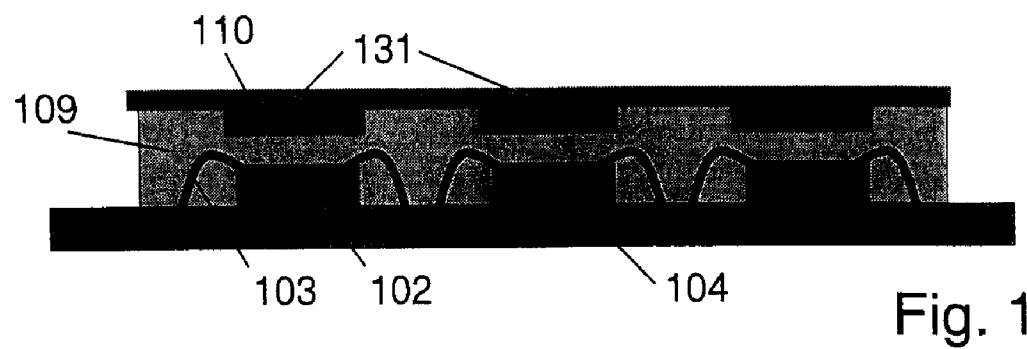
FIGS. 18 and 19 embodiments of wafer-scale packaging combined with optical structures.

As yet another alternative, the PDMS layer may be structured as well. For example, one can make cavities where replication is locally confined. This principle is shown in FIG. 18. The cavities 131 are provided in the PDMS layer 109 at places where the thin outermost layer 110 is to be provided with micro-optical structures. The outermost layer is provided in a manner that the cavities are filled and that, for example, an even surface is provided. This makes it possible that, except for the places of the cavities, the outermost layer is very thin indeed. In this way, the step of subsequently separating the individual devices by dicing is facilitated, since the outermost material is preferably of a very hard material, which is not easy to dice.

Figure 19:
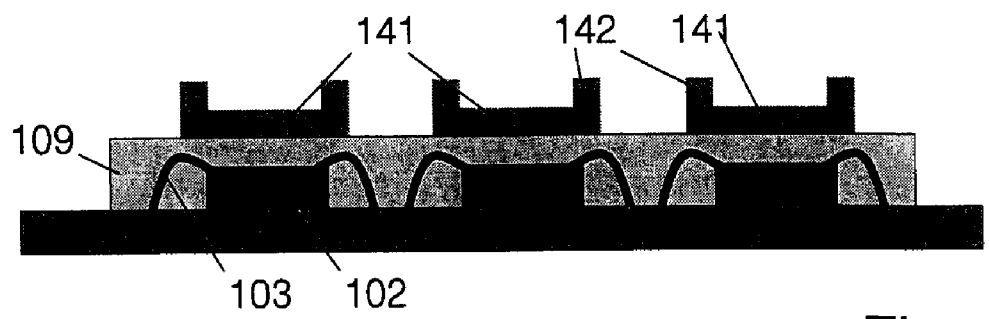

Yet another alternative of "wafer-scale" encapsulating and combination of opto-electronic with optical functionality is shown in FIG. 19. In this embodiment, the thin outermost layer does not completely cover the PDMS layer 109 on a wafer scale, but is confined to spots corresponding to the places where an optical functionality and protection is desired. The product is free of the material of the outermost layer at places along the dicing lines. The according spots 141 of, for example, UV curable epoxy may, for example, be provided with spacer portions 142 along their edges for mechanical protection of micro-optical structures. The confinement of the layer to spots 141 as well as the spacer portions may be provided in the step of replicating the micro-optical structures by according features provided in the replication tool.

Whereas the special structural features of the first and the second layer, respectively, in FIGS. 18 and 19 are described referring to "wafer-scale" interposers, they may also be present in the embodiment of the invention described with reference to FIG. 17, for example, in connection with an optoelectronic wafer.

A method of manufacturing a package comprising at least one optoelectronic device may include the casting of a layer of a first transparent material, of curing, of potentially repeating the casting and curing steps for more layers with different or identical material. Potential cavities in the first transparent material layer may be provided by applying an accordingly structured tool during curing. Then, material of an outermost layer is provided, and potentially optical structures are replicated into the outermost layer. During this replication step, also, an additional structuring of the outermost layer may be achieved, for example, the confinement of the outermost layer to discrete spots and/or the providing of spacer portions. Next, the outermost layer is cured/hardened before removal of the replication tool. Finally, in case of a "wafer-scale" process, the package may be separated into individual optoelectronic devices.

This casting approach has the advantage that mechanically sensitive bonding wires are not damaged. As an alternative, one or more of the layers may be fixed by gluing or laminating.

Next to the above described embodiments of the invention, there are various other embodiments. For example, the principle described with reference to FIGS. 15-19 may also be used in embodiments of an optical system containing just passive optical elements.

What is claimed is:

1. A method of manufacturing an integrated optical system comprising the steps of:
   providing a wafer with active optical components, each active optical component having an optically active surface;
   providing optical structures allocated to the active optical components operable to influence electromagnetic radiation emitted by the optically active surface and/or electromagnetic radiation impinging on said optically active surface, wherein the optical structures are provided by the following steps:
      by adding a protection layer to the wafer, the protection layer partially covering the wafer's surface,
      by disposing transparent material in a liquid or plastically deformable state, on at least some of the active optical components,
      by replicating the optical structures by a replication tool, in an aligned manner, in a surface of said transparent material, wherein in the replication process the replication tool abuts the protection layer, or a protrusion thereof, and
      by removing the protection layer;
   the method of manufacturing the integrated optical system further comprising the step of separating the wafer with the optical structures into parts containing at least one active optical component and at least one optical structure.

2. The method according to claim 1, wherein the transparent material comprises at least two layers of transparent material, wherein a first one of said two layers covering said active optical components is thicker than a second, outermost one of said at least two layers.

3. The method according to claim 2, wherein disposing the transparent material includes casting said first layer onto said active optical components and disposing said outermost layer onto the first layer or onto potential intermediate layers, and wherein replicating the optical structures includes embossing said structures into the outermost layer.

4. The method according to claim 1, wherein said replication tool comprises a trough like feature forming a cavity when the replication tool is placed on a flat surface, the structures in the replication tool being in the trough like feature.

5. The method according to claim 4, wherein the transparent material is disposed, in a liquid or plastically deformable state, locally at places where the optical structures are to be, and wherein the trough like feature prevents transparent material from flowing outside a confined area during the replication process.

6. The method according to claim 4, wherein the transparent material is disposed, in a liquid or plastically deformable state, in the trough like feature on the replication tool, and wherein the transparent material is attached to the wafer before or after curing.

7. The method according to claim 5, wherein the replication tool further comprises channels connected to the cavity.

8. The method according to claim 1, wherein the transparent material is disposed, in troughs formed by recesses of the protection layer or is disposed extensive on the wafer comprising the protection layer.

9. The method according to claim 8, wherein a dicing step is performed after a curing step and before the protection layer removal, the dicing step including cuffing through the transparent material at places bordering the protection layer.

10. The method according to claim 8, wherein the replication tool comprises a recess in which the structures to be replicated are offset with respect to an outermost surface of the replication tool.

11. The method according to claim 8, wherein the protection layer comprises abutment protrusions protruding from at least a part of its borders.

* * * * *

UNITED STATES PATENT AND TRADEMARK OFFICE
CERTIFICATE OF CORRECTION

PATENT NO. : 7,457,490 B2
APPLICATION NO. : 11/466640
DATED : November 25, 2008
INVENTOR(S) : Hartmun Redmann et al.

It is certified that error appears in the above-identified patent and that said Letters Patent is hereby corrected as shown below:

The sheets of drawings consisting of figures 4-12 and 17-19 should be deleted and substitute therefore the attached figures.

Column 16, Line 9 (Claim 9, Line 3), delete "cuffing", and insert --cutting--.

Signed and Sealed this

Twenty-second Day of June, 2010

David J. Kappos
*Director of the United States Patent and Trademark Office*